United States Patent
Holland

[11] Patent Number: 5,995,409
[45] Date of Patent: Nov. 30, 1999

[54] ELECTRICALLY-PROGRAMMABLE READ-ONLY MEMORY FABRICATED USING A DYNAMIC RANDOM ACCESS MEMORY FABRICATION PROCESS AND METHODS FOR PROGRAMMING SAME

[75] Inventor: Wayland Bart Holland, Dallas, Tex.

[73] Assignee: Silicon Aquarius, Inc., Tex.

[21] Appl. No.: 09/045,259

[22] Filed: Mar. 20, 1998

[51] Int. Cl.[6] .................................................. G11C 11/24
[52] U.S. Cl. ...................... 365/149; 365/185.08; 365/104
[58] Field of Search ............................. 365/149, 185.08, 365/185.19, 104; 257/298

[56] References Cited

U.S. PATENT DOCUMENTS 5,331,188  7/1994  Acovic et al. ........................... 257/298
5,365,477  11/1994  Cooper, Jr. et al. ................. 365/149 X
5,875,127  2/1999  Yin ........................................ 365/185.2

*Primary Examiner*—Huan Hoang
*Attorney, Agent, or Firm*—James J. Murphy; Winstead Sechrest & Minick

[57] ABSTRACT

A method of permanently programming selected cells of dynamic random access memory cell array. First selected cell is programmed to a Logic 1 by grounding a first capacitor plate of the first cell, and applying a programming voltage to a second capacitor plate common to the cells of the array. A dielectric disposed between the first capacitor plate and the second capacitor plate breaks down, thereby shorting the first and second capacitor plates. A second selected cell is programmed to store a Logic 1 by allowing a first capacitor of the second cell to float during a period when the programming voltage is applied to the second capacitor plate.

20 Claims, 6 Drawing Sheets

ELECTRICALLY-PROGRAMMABLE READ-ONLY MEMORY FABRICATED USING A DYNAMIC RANDOM ACCESS MEMORY FABRICATION PROCESS AND METHODS FOR PROGRAMMING SAME

CROSS-REFERENCE TO RELATED APPLICATION

The following co-pending and co-assigned applications contain related information and are hereby incorporated by reference:

Ser. No. 08/759,764 (Attorney Docket No. 2836-P05445), entitled "DIGITAL STEP GENERATORS AND CIRCUITS, SYSTEMS AND METHODS USING THE SAME", filed Dec. 3, 1996.

TECHNICAL FIELD

The present invention relates in general to electronic memories, and in particular, to an electrically-programmable read-only memory fabricated using a dynamic memory process, and methods for programming the same.

BACKGROUND INFORMATION

As semiconductor technology has advanced, data processing applications have also rapidly evolved to provide personal services to individual users. Such data processing applications include personal digital assistants (PDA), personal digital communicators (PDC), pocket schedulers, and the like. In implementing such data processing application, a dynamic random access memory and a read-only memory are generally used to provide the proper storage devices required for operation of these data processing applications. For example, the read-only memory (ROM) is typically utilized to store an operating system (OS) for the data processing application. As well, the dynamic random access memory (DRAM) may provide the necessary data memory and read-write memory required when performing operations within the data processing system.

While both DRAM and ROM memories are needed to implement most data processing applications, the methodologies utilized to fabricate each of these types of data processing systems are quite different and it is therefore not optimal to use one technique to build both types of memory on the same integrated circuit chip. As is well-known in the semiconductor art, ROM memories are typically implemented using either diffusion programming, gate programming, or metal programming techniques. Metal programming techniques selectively pattern metal conductors within the ROM to program that memory in accordance with the user's needs. Metal programming is particularly attractive as it is typically performed late in the ROM fabrication processing stage and, therefore, allows a designer of the memory system or a CPU or a microcontroller, to modify or create new programming code for an application late in the manufacturing process. However, while metal programming has such useful characteristics and is often used during ROM programming, metal programming is difficult to implement in a DRAM manufacturing process is utilized as process. Among other things, the normal number of metal layers which can be fabricated is limited, for the most part, to two in DRAMs. However, two metal layers are often insufficient to provide the desired number of metal layers required for ROM programming.

In addition to metal programming, gate programming may be utilized to program a ROM. When a ROM is programmed using the gate programming technique, the gate for the ROM memory cell is formed approximately during a mid-point of the processing steps. In contrast, a gate is formed in a DRAM during the initial steps of the DRAM manufacturing process because a capacitor utilized in a DRAM cell is then built on top of the gate. Thus, a DRAM process does not result in an optimal methodology for implementing gate programmed ROMs.

Furthermore, diffusion programming of ROMs also fails to result in optimal results when a DRAM process is used. In diffusion programming, the transistor drains are selectively implanted or masked in a diffusion process. Specifically, such diffusion programming is inflexible and does not allow a user to re-program or modify an existing program determined by diffusion wells formed during early manufacturing steps.

For these reasons, the DRAMs and ROMs are typically implemented on separate chips in today's IAs (information appliances) and then interconnected to the remainder of the system using a printed circuit board. Because at least two separate integrated circuit chips must then be utilized to provide the desired functionality, the size of resulting products is limited by the dimensional requirements of the two integrated circuit devices, not to mention power and system cost. In a technology where smaller size connotes the desired characteristics of faster speeds and lower power consumption, the requirement that devices be implemented in two separate integrated circuits may have prohibitive overhead costs for some applications. Additionally, if two integrated circuits are utilized to implement both a DRAM and a ROM in a data processing system, the performance of that system will necessarily be limited by the power consumption and speed limitations inherent in the use of two separate devices.

Therefore, a need exists for an integrated circuit that may implement both DRAMs and any non-volatile memory, including ROM, to reduce the power consumption and overhead costs associated with the implementation of two separate integrated circuits in some data processing applications. Additionally, a need exists for a methodology for manufacturing both DRAMs and non-volatile memories on a same integrated circuit in an efficient and reliable manner. Such an implementation can also enhance the "optimization of total memory address space and memory" for an IA (Information Appliance). Finally, for even further flexibility, it would be highly desirable to have the option of making at least some of the ROM cells electrically-programmable (i.e providing EPROM cells on-chip with DRAM cells and/or mask programmable ROMs.

SUMMARY OF THE INVENTION

According to one embodiment of the present inventive teachings, a method is provided for permanently programming selected cells of a dynamic random access memory cell array. A first selected cell is programmed to store a Logic 1 by grounding a first capacitor plate of the first cell and applying a programming voltage to a second capacitor plate common to the cells of the array. A dielectric disposed between the first capacitor plate and the second capacitor plate breaks down, thereby shorting the first and second capacitor plates. A second selected cell is programmed to store a Logic 0 by allowing a first capacitor of the second cell to float during a period when the programming voltage is applied to the second capacitor plate.

According to another embodiment of principles of the present invention, a method is provided for programming selected cells in an array of rows and columns of memory cells, the cells of the array sharing a common capacitor plate and each cell having the data storage capacitor plate spaced from the common capacitor plate by a dielectric. A wordline coupled to the first and second cells of a selected row in the array is activated to couple the first cell to a first bitline and a second cell to a second bitline. The first bitline is coupled to a low voltage and the second bitline is allowed to float with respect to the low voltage. The program voltage is applied to the common capacitor plate for creating a short between the common plate and the storage plate of the first capacitor through the dielectric, thereby programming the first cell to a Logic 1 and the second cell to a Logic 0.

A further embodiment of the present invention can be found in an electrically programmable read-only memory cell array fabricated using a dynamic random access memory process. The array includes a common capacitor plate, a dielectric layer disposed adjacent the common capacitor plate, a first cell storing a Logic 0 comprising a storage capacitor plate spaced from the common capacitor plate by the dielectric layer and a second cell storing a Logic 1 comprising a storage capacitor plate shorted to the common capacitor plate through the dielectric layer.

An additional embodiment is provided in a memory chip including an electrically programmable read-only memory cell fabricated using a DRAM process. The memory cell includes a first capacitor plate spaced from a second capacitor plate by a dielectric and a transistor for selectivly coupling the second capacitor plate to a bitline. The memory chip also includes circuitry for programming the memory cell. Such circuitry is operable to program the cell to a Logic 1 by grounding the second plate and applying a programming voltage to the first plate to cause the dielectric to break down and short the first and second plates. To program the cell for a Logic 0, the circuitry for programming allows the second plate to float during a period when the programming voltage is applied to the first capacitor plate.

The principles of the present invention have substantial advantages over the prior art. Most importantly, since the same fabrication process is being used, both EPROM and DRAM cells can be provided on a single chip. This is particularly advantageous for the construction of embedded systems, such as portable communication and data processing systems which require both random access memory and read-only memory on-chip. The ability to electrically program read-only memory advantageously allows for custom programming after the chip has been fabricated. Additionally, the EPROM embodiments of the present invention allow for a reduction in process steps normally required during the fabrication of a masked ROM.

These and other features, and advantages, will be more clearly understood from the following detailed description taken in conjunction with the accompanying drawings. It is important to note the drawings are not intended to represent the only form of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
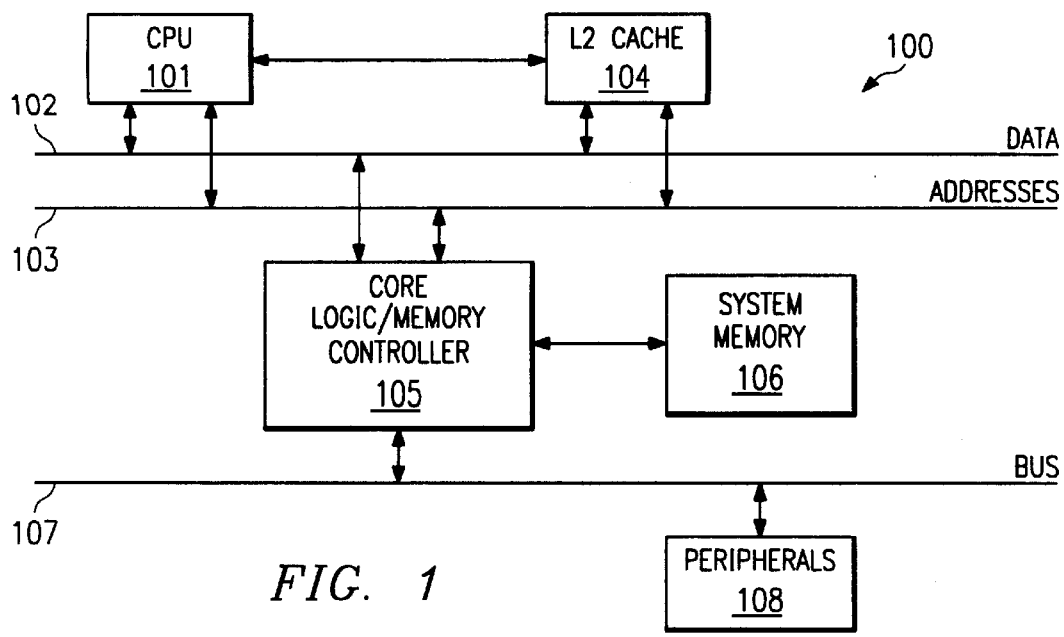
FIG. 1 illustrates, in block diagram form, a data processing system architecture in accordance with one embodiment of the present invention.

The present invention implements a data processing system having a DRAM and a non-volatile memory, such as a ROM or a programmable ROM (PROM), on a single integrated circuit to provide for data processing applications that have lower area requirements, lower power consumption, and quicker performance. Specifically, the present invention implements a methodology to form a data processing system having a DRAM and a non-volatile memory on a single integrated circuit using a same process methodology for both. To better understand implementation and operation of the present invention, a description of a data processing system environment and the structure of a DRAM device will be described in further detail herein.

Before providing that description, however, note that in the following description, numerous specific details are set forth to provide a thorough understanding of the present invention. However, it will be obvious to those skilled in the art that the present invention may be practiced without such specific skills. In other instances, well-known circuits have been shown in block diagram form in order not to obscure the present invention in unnecessary detail. Additionally, for the most part, details concerning timing considerations and the like have been omitted inasmuch as such details are not necessary to obtain a complete understanding of the present invention and are within the skills of persons of ordinary skill in the relevant art. Furthermore, during a description of the implementation of the invention, the terms "assert" and "negate" and various grammatical forms thereof, are used to avoid confusion when dealing with the mixture of "active high" and "active low" logic signals. "Assert" is used to refer to the rendering of a logic signal or register bit into its active, or logically true, state. "Negate" is used to refer to the rendering of a logic signal or register bit into its inactive, or logically false, state.

Refer now to the drawings wherein depicted elements are not necessarily shown to scale and wherein like or similar elements are designated by the same reference numeral through the several views. It should be noted that, with regard to the formation of the semiconductor structures described below, like numbers represent structures fabricated concurrently and/or using the same process step.

FIG. 1 is a high level functional block diagram of a portion of a data processing system 100. Data processing system 100 maybe a PDA (Personal Digital Assistant), a PDC (Personal Digital Communicator), a pocket scheduler, and the like. System 100 comprises a central processing unit 101, a CPU local data bus 102, a CPU local address bus 103, an external (L2) cache 104, a core logic/memory controller 105, a system memory 106, an external bus 107, and a plurality of peripherals 108. In system 100, peripherals 108 are coupled to core logic/memory controller 105 via external bus 107. External bus 107 may be a peripheral controller interface (PCI) bus. Alternatively, external bus 107 could be an ISA, general, or specific purpose bus, as known in the art. Furthermore, should peripherals 108 be external to data processing system 100, external bus 107 may be implemented as an ISA, PCI, VESA, IDE, general, or special purpose bus to access peripherals 108 from an external device or system (not illustrated herein).

In data processing system 100, CPU 101 is the "master" which, in combination with the operating system (OS) and application software, controls the overall operation of data processing system 100. It should be noted the OS may be stored with a non-volatile memory (ROM or hard disk). Among other things, CPU 101 performs various data processing functions including numerical and word processing, generates graphics data, and performs overall system management. CPU 101 may be, for example, a complex instruction set computer (CISC), such as an Intel Pentium™ class microprocessor, a reduced instruction set computer (RISC), such as a PowerPC microprocessor available from IBM, Inc. or Motorola, Inc., or a very long instruction word (VLIW) machine. Additionally, it should be understood that CPU 101 may be another class or family of a controller or processor that is not specifically provided herein.

CPU 101 communicates with the remainder of data processing system 100 via CPU local address and data buses 102 and 103, each of which may be a special bus or a general bus, as is known in the art.

Core logic/memory controller 105, under the direction of CPU 101, controls the exchange of data, addresses, control signals, and instructions between CPU 101, system memory 105, and peripherals 108 via bus 107. Although core logic/memory controller 105 allows tasks to be shifted from CPU 101 to allow CPU 101 to attend to other CPU-intensive tasks, CPU 101 can always override core logic/memory controller 105 to initiate execution of a higher priority task.

Core logic and memory controllers are widely available in the data processing industry, including the personal computer (PC) industry, and their selection and application are well-known by those skilled in the relevant art. The memory controller can be either a separate device or incorporated in the same chip set as the core logic. The memory controller is generally responsible for generating the memory clocks and control signals, such as system clock (SCLK), row address strobe (/RAS), column address strobe (/CAS), Read/ Write (R/W̄), and Bank Select, each of which is not illustrated in detail in FIG. 1. The memory controller also monitors and controls cell refresh operation necessary for DRAM memories. Furthermore, the memory controller may also have some address generation capability for accessing sequences of pages within memory accessible by data processing system 100. System memory 106 is implemented in the DRAMs.

Core logic/memory controller 105 is typically comprised of a chip-set, with one or more chips typically being "address and system controller intensive" and one or more of the chips typically being "data intensive." Among other things, the address intensive chips interface CPU 101 via address bus 103 and maintain the cache memory, including the cache tags, set associative cache tags and other data necessary to insure cache coherency. Additionally, the address intensive chips perform cache "bus snooping" and generate the control signals required for DRAMs in the system memory or cache, as well as other types of system memory. Furthermore, the address intensive chips control general management transactions within the system. The data intensive chips typically interface CPU 101 via data bus 102, issue cycle completion responses, and selectively abort operations if their cycles are incomplete. The data intensive chips also arbitrate a data path of bus 102.

CPU 101 may directly communicate with core logic/ memory controller 105 or may communicate thereto through an external (L2) cache 104. L2 cache 104 may be implemented as SRAM device, in one example. Additionally, CPU 101 also maintains on-chip (L1) cache memory that is not illustrated in detail herein.

Peripherals 108 may include a display controller and associated frame buffer, floppy drive controller, disk drive controller, and/or modem, and the like.

It should be noted that, although not illustrated herein, the principles of the present invention may also be embodied in multiprocessing devices and systems which are known to those with skill in the art.

In a PDC, PDA, IA today, core logic and peripheral control functions are integrated in the CPU (unlike desktop PCs).

Figure 2:
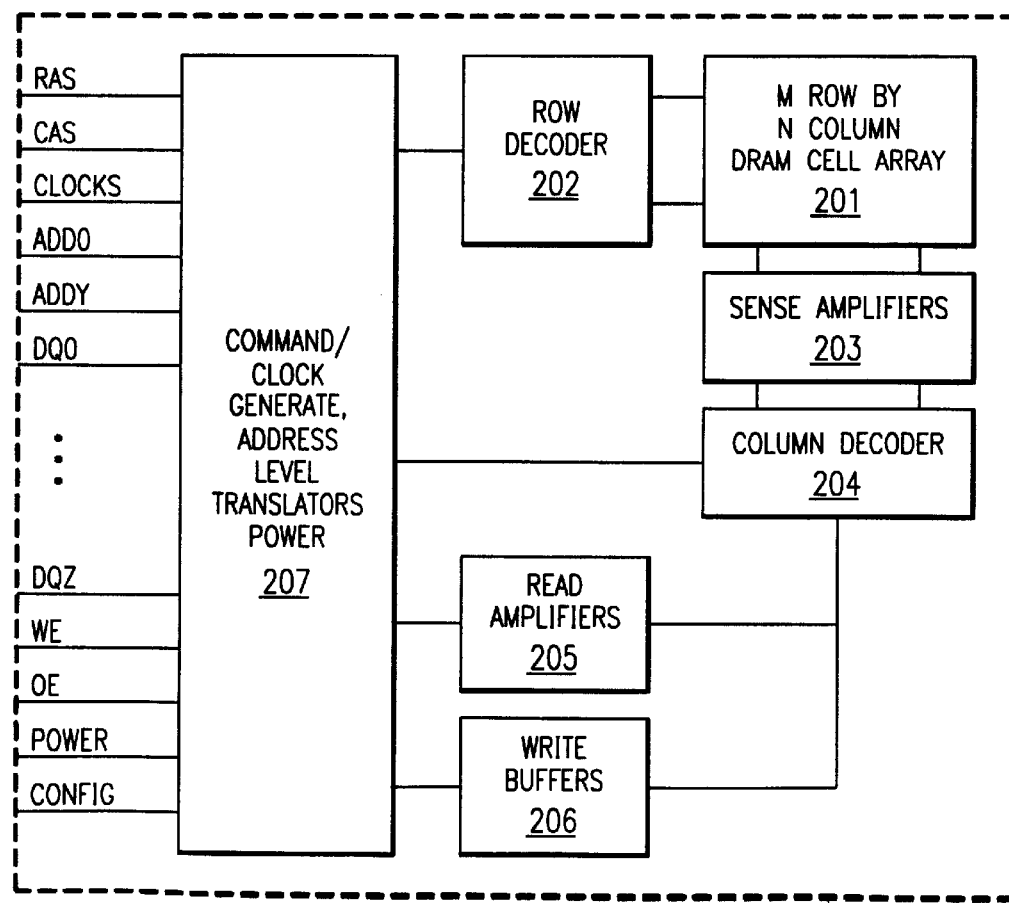
FIG. 2 illustrates, in block diagram form, a functional block diagram of a dynamic random access memory (DRAM) device according to one embodiment of the present invention.

FIG. 2 illustrates one embodiment of a dynamic random access memory (DRAM) device 200 implemented in accordance with one embodiment of the present invention. It should be noted that DRAM 200 may be implemented within data processing system 100 as L2 cache 104 or system memory 106. Furthermore, DRAM device 200 may also be implemented as another memory not illustrated within FIG. 1.

Memory 200 includes an M row by N column DRAM cell array 201, a row decoder 202, a plurality of sense amplifiers 203, a column decoder 204, a plurality of read amplifiers 205, a plurality of write buffers 206, and a command/clock generate, address level translators power circuit 207.

It should be noted that M row by N column DRAM cell array 201 is typically divided into a plurality of memory banks. An actual number of memory banks may vary from application to application. Each bank includes an array of dynamic random access memory (DRAM) cells arranged in rows and columns. As is known to those skilled in the art, each array may be partitioned into multiple sub-arrays, with the columns organized using either an open-bitline or a folded-bitline approach. Each bank is then accessed by an appropriate combination of control signals provided by row decoder 202 and column decoder 204. Row decoder 202 and column decoder 204 are preferably organized in a hierarchial fashion in which a main decoder and one or more levels of sub-decoders/drivers are utilized to access each of the banks. Generally, during operation, and in response to a row address latched on the falling edge of the row address strobe (/RAS), row decoder 202 will select one of M rows for access during an active cycle after /RAS has transitioned to a logic low value. Column decoder 204 then selects a number of pages (locations) of columns along the selected row from the total number of columns in response to a number of column addresses sent to column decoder 204 in response to the falling edges of on external and/or internal column address strobe (/CAS).

Circuit 207 receives conventional DRAM control signals and clocks from an external source, such as CPU 101 or core logic/memory controller 105 in data processing system 105. These signals include a row address strobe (/RAS), a column address strobe (/CAS), a Clock signal, a plurality of addresses (ADD0 through ADDY), a plurality of data signals (DQ0 through DQZ), a write enable (WE), an output enable (OE), a Power signal, and a configuration bit (CONFIG). In one embodiment of the present invention, the address input port is multiplexed in the conventional manner, wherein row addresses and column addresses are received sequentially at the same pins and latched to DRAM 200 using this /RAS and /CAS signals, respectively. Operation of a DRAM cell is described in greater detail in U.S. Pat. No. 5,452,244 by G. R. Mohan Rao, and U.S. patent application Ser. No. 08/955,944, Attorney Docket No. 17200-P001CP1), each of which incorporated by reference herein.

Furthermore, although not illustrated in detail herein, the operation and implementation of a non-volatile memory system are well-known to those with skill in the data processing art and, therefore, will not be described in greater detail herein.

While both the DRAM and the non-volatile memory provide storage capability in a data processing system, a structure of each and the method steps required to manufacture each are significantly different. It is these differences that have not allowed DRAMs and non-volatile memories to be optimally implemented on a single integrated circuit in prior art implementations. However, the present invention identifies a methodology that allows such processing variations to be overcome so that a DRAM and a non-volatile memory may be implemented on a same integrated circuit device.

Figure 3A:
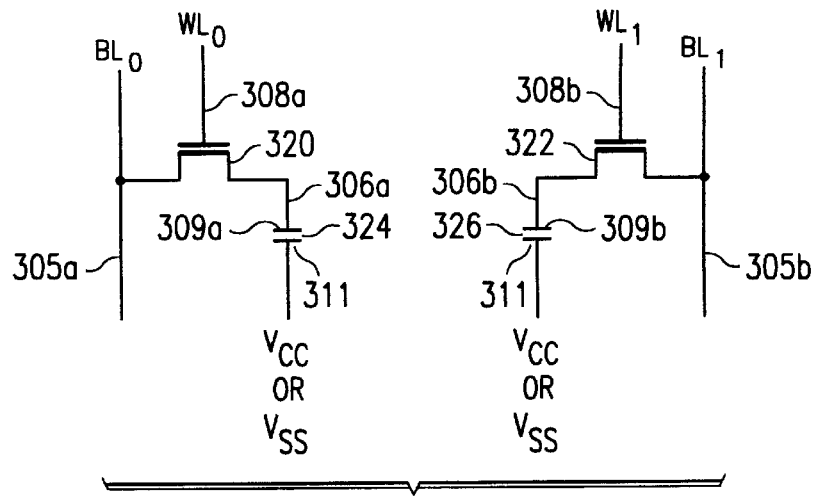
FIG. 3A illustrates, in circuit diagram form, a dynamic random access memory manufactured in accordance with one embodiment of the present invention.

DRAM cell array 201 comprises a plurality of memory cells such as the pair of cells illustrated in FIG. 3A. Each DRAM memory cell comprises a transistor (320, 322) and a capacitor (324, 326). As illustrated in one of the cells of FIG. 3A, a first bit line, $BL_0$, is coupled to a first terminal of transistor 320 and a wordline, $WL_0$, is coupled to a gate of transistor 320. A second terminal of transistor 320 is coupled to a first terminal of capacitor 324. A second terminal of capacitor 324 is coupled to a reference voltage. The reference voltage may be $V_{SS}$ (or ground) or $V_{CC}$ or same intermediate voltage. Transistor 322 is similarly configured. During operation of a DRAM memory cell, the presence of charge (electrons) in capacitor 324 (326) indicates a logical 0 value and the absence of charge in capacitor 324 (326) indicates a logical 1 value is stored in the memory cell. Alternate methods for determining a logic value to be associated with energy stored in a capacitor are also available, as is well-known to those with skill in the relevant art.

During operation, when a wordline is selected, all transfer devices (such as transistors 320, 322) connected to the wordline are enabled and charge transfer occurs between an associated capacitor (such as capacitors 324 and 326) and the bitline to which the transistor is coupled. Furthermore, before a read or write operation to the memory cell, the bitline is pre-charged to a predetermined voltage, $$\frac{V_{CC}}{2},$$

in one embodiment. It should be noted that other pre-charge schemes well-known in the data processing art will also function equally as well.

To read the memory cell, the selected wordline is raised to a $V_{CC}$ voltage level, or higher, thereby turning on the transistor and all other transfer devices (not illustrated herein) connected to the wordline. Sensing of data and latching are then performed by sense amplifiers (such as sense amplifiers 203 of FIG. 2) to determine a logic value to be associated with the memory cell.

In implementing a DRAM memory cell, certain processing steps must be executed to insure that a capacitor having the appropriate dimensions is implemented. Specifically, processing steps are typically implemented for forming a stacked capacitor, wherein the capacitor is partially constructed above the silicon surface. Many different methodologies exist for forming various types stacked capacitors and are dependent upon a process implemented by the manufacturer. Therefore, a following description of a methodology implemented to manufacture a DRAM cell will not include the specifics of the manufacturing process, as such specifics vary from process to process for manufacturing DRAM memory cells. Rather, the present invention allows such manufacturing processes to be varied to allow a DRAM cell and a non-volatile memory cell to be implemented on a single integrated circuit.

Figure 3B:
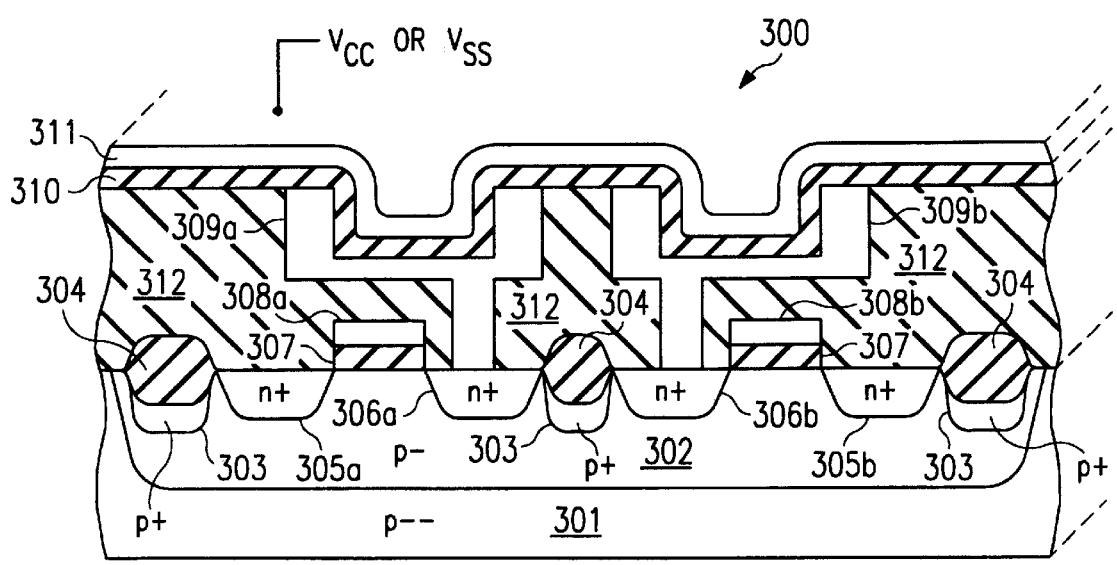
FIG. 3B illustrates, in a cross-sectional view, the dynamic random access memory device of FIG. 3A.

Refer now to FIG. 3B for a description of the steps performed to manufacture a DRAM cell in accordance with the principles of the present invention. The DRAM cell structure 300 illustrated in FIG. 3B is a cross-sectional view of the devices formed during a semiconductor manufacturing process. It should be noted that for brevity and clarity, the overlying insulating and metal layers are not illustrated in the figures provided herein. Note that numbers within the circuit diagram of FIG. 3A correspond to elements within the devices illustrated in FIG. 3B. For example, $BL_0$ 305A corresponds to source/drain implant 305A of FIG. 3B and $WL_0$ 308A is implemented as a polysilicon conductor 308A of FIG. 3B. Similarly, element 306A of FIG. 3A corresponds to source/drain implant 306A of FIG. 3B. Additionally, the first terminal 309A of the capacitor corresponds to cylindrical capacitor 309A of FIG. 3B and element 311 of FIG. 3A corresponds to a capacitor plate 311 of FIG. 3B. It should be noted that capacitor 324 is formed from polysilicon in one embodiment of the present invention.

A brief description of the steps required to manufacture a DRAM cell will now be provided herein. As a prelude to this discussion, it should be understood that alternate methods of manufacturing DRAM cells may also be implemented and then adapted in accordance with the principles of the present invention to form a single integrated circuit having both a DRAM and a non-volatile memory.

Refer now to FIG. 3B. A P-substrate 301 has a P-"well" or "tank" 302 formed therein. Well 302 may be formed by an implant of boron and a subsequent thermal drive in one embodiment of the present invention. Additionally, an N-well (not shown) may be formed by implantation or diffusion to provide a well for the fabrication of any P-channel transistors peripheral to structure 300. As is illustrated in FIG. 3B, isolation oxide regions 304 are grown over channel stops 303 by masking thermal oxidation to define an active region over which the transistors and capacitors required to manufacture the DRAM memory cell are to be formed.

While FIG. 3B illustrates only N-channel active areas, it should be well-known to those with skill in the art that the active regions may also contain P-channel active areas. Furthermore, it should be noted that the active areas may be defined using any one of a number of isolation techniques such as trench isolation.

Subsequently, a gate oxide layer 307 and conductive gate 308a of each transistor implemented in the DRAM memory cell are formed. Gate oxide 307 and gate conductor 308a may be formed by successively depositing layers of oxide and polycrystalline silicon ("polysilicon") across the face of a processed silicon substrate, doping the polysilicon either chemically (chemical vapor deposition) or by implantation to render it conductive, and then performing a stack etch. In alternate embodiments, where buried contacts are desired between gate 308a and a given source or drain doped region (306a, 306b), gate oxide 307 may be formed by oxide deposition and patterned etching, with conductive gate 308a formed after the formation of the transistor source or drain regions (306a, 306b) described below. Furthermore, in another embodiment, gate 308a may be formed from silicided polycrystalline silicon ("polycide"). For example, the polysilicon gate conductors may be silicided with tungsten, molybdenum, tantalum, or titanium, in some embodiments of the present invention. It should be noted that while the above discussion describes a self-aligning process, the principles of the present invention can equally be applied to other processes known in the art.

Next, the source/drain regions (305a and 306a, 305b and 306b) are created using standard doping or implementation procedures. In a given array of memory cells, the source/drain region 305a depicted for a first transistor is shared by other transistors along a corresponding column of cells to form an associated column line (bitline) conductor. For example, N+ doped region 305a corresponds to $BL_0$ (Bitline 0) of FIG. 3A. In a similar vein, it should be noted that gate 308a is also coupled to multiple other transistors along a same wordline. For this reason, gate 308a corresponds to $WL_0$ (Wordline 0) of FIG. 3A.

It should be noted that the source drain regions 305a, 305b, 306a, and 306b illustrated in FIG. 3B, may be formed by masking and implanting with appropriate substances. It should be recognized that in alternate embodiments, the source and drain regions may be foregone between "overlapping" active regions and/or lightly doped regions may be formed where appropriate. Additionally, it should be recognized that capacitors are formed in regions coupled to the source and drain regions described above. If one conductor of a capacitor is to be tied to a reference ground voltage ($V_{SS}$), then an additional implant of an appropriate substance required to dope this region of the transistor may be performed to form a natural inversion layer for the memory storage array.

In memory cells 300, conductive plates 309 for cylindrical or spherical stacked capacitors are formed within insulator (oxide) region 312. Capacitor conductor 309a (309b) corresponds to the node plate of capacitor 324, as illustrated in FIG. 3A. After formation of this terminal of capacitor 324, a high dielectric constant insulator 310 is deposited and acts as a capacitor dielectric. In one implementation of the present invention, insulator 310 comprises a layer of oxide. Subsequently, a layer 311 of polycrystalline silicon is deposited across the face of the silicon device in which the memory cell is implemented. Polysilicon layer 311 is doped to render it conductive, either chemically or by implantation. Polysilicon layer 311 may also be silicided. Polysilicon layer 311 acts as the fixed voltage plate capacitor and is coupled to either $V_{CC}$ (+5 volts, or the like) or $V_{SS}$ (0 volts).

The specifics of the steps required to build a DRAM cell using a stacked capacitor structure such as that described with respect to FIG. 3B are well-known to those will skill in the relevant data processing art. For this reason, the methodologies utilized to build such a device will not be discussed in greater detail. However, it should be well-known that alternate embodiments may also be utilized for building a DRAM cell having a stacked capacitor structure and these embodiments may be modified to form a DRAM memory array and a non-volatile memory array on a same integrated circuit.

The present invention recognizes that a non-volatile memory may be manufactured on a same integrated circuit as a DRAM array with the advent of processing techniques for manufacturing a multi-layer polysilicon stacked capacitor, such as that described in FIGS. 3A and 3B. Specifically, the process for manufacturing both the DRAM and the non-volatile memory is identical for each of the steps executed prior to formation of the stacked capacitor. Therefore, in a following discussion of alternate embodiments of a non-volatile memory implemented in accordance with the principles of the present invention, will not be discussed again in greater detail as they have previously been discussed with respect to manufacturing the DRAM memory cell.

Figure 4A:
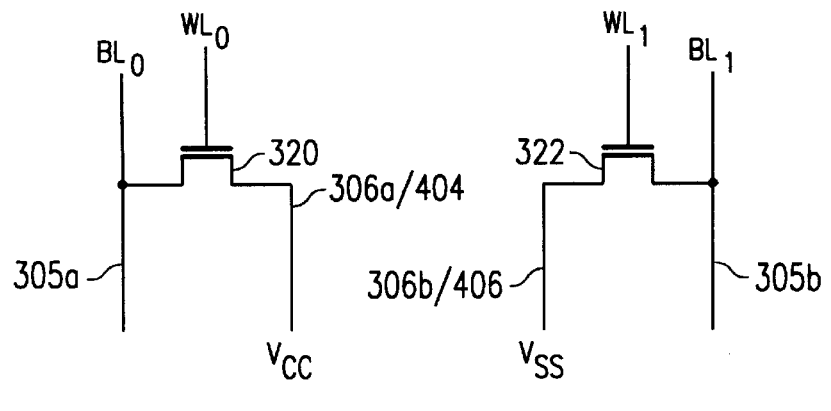
FIG. 4A illustrates, in circuit diagram form, a first embodiment of a non-volatile memory implemented in accordance with the principles of the present invention.
Figure 4B:
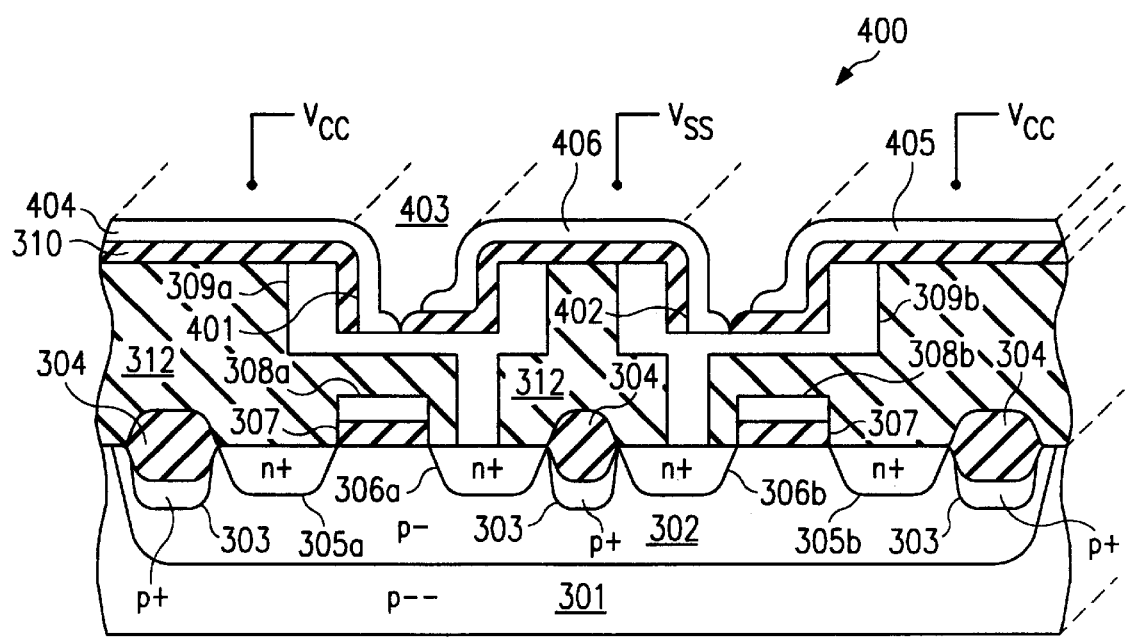
FIG. 4B illustrates, in a cross-sectional view, the non-volatile memory device of FIG. 4A.

Refer now to FIG. 4A and FIG. 4B. FIG. 4A illustrates a circuit diagram of non-volatile memory cells, such as ROM cells, formed using the DRAM process described above through the process of depositing dielectric 310. After that, only two further conventional steps are required to form vias through dielectric 310 and etch conductive layer 311 into strips 404, 405 and 406. It should be noted that the present invention principles may be applied to the fabrication of "volatile" memory cells. (They are volatile because they lose their ability to be correctly store data when the power supply is turned off). As well, it should be noted that polysilicon conductor 308a corresponds to $WL_0$ and diffusion 305a corresponds to $BL_0$ of FIG. 4A.

In FIG. 4A, each of the memory cells comprises a single transistor programmed to a predetermined logic level. Specifically, transistor 320 is programmed to a logic high value since its node plate 309 is shorted to $V_{CC}$. Similarly, transistor 322 is programmed to a logic low value as node plate is coupled to $V_{SS}$.

Specifically, the present invention recognizes that the stacked polysilicon layers that serve as a capacitor for a DRAM cell may be coupled to a known logic state to form a non-volatile memory cell. To provide this connection, the same processing steps are utilized to manufacture a memory structure up to the formation of a first terminal 309a and 309b of the stacked capacitors utilized to form the DRAM memory device. At this point, an intermediate step is utilized to implement a non-volatile memory. In this intermediate step, vias 401 and 402 are patterned and etched through insulator 310 over a portion of the stacked polysilicon layers of the node plate of the corresponding capacitor. Subsequently, a conductive polysilicon layer is deposited onto a surface of the semiconductor device in a pattern that reflects a programming state of the non-volatile memory cell. Stated another way, alternate $V_{CC}$ or $V_{SS}$ conductive strips may be patterned on top of a storage electrode (or node) of the non-volatile memory cell in a desired fashion. It should be noted that the conductive strips may also be metal or polycide, as well as other well-known conductors. Furthermore, it should be noted that many other possibilities exist for memory coding and programming and will subsequently be described in greater detail herein.

As illustrated in FIG. 4B, polysilicon layer 404 of memory cells 320 is coupled to $V_{CC}$. Additionally, polysilicon layer 404 is coupled to conductive polysilicon plate 309a. Thus, a connection between a terminal of transistor 320 is coupled to $V_{CC}$.

Similarly, transistor 322 is coupled to $WL_1$ and $BL_1$ and is also depicted within FIG. 4B. In this case, note that transistor 322 is coupled to $V_{SS}$, or a logical 0 value. In this case, via 402, patterned and etched through insulator 310 to expose a first terminal 309b of the stacked polysilicon capacitor formed by the DRAM process, allows for the short to $V_{SS}$ strip 406. By coupling polysilicon layer 406 to the terminal 309b of the stacked polysilicon capacitor, a connection to $V_{SS}$ is formed for a first electrode of transistor 322. Gate 308b is coupled to $WL_1$ and a second electrode of transistor 322 is formed by bitline diffusion 305b.

By executing an intermediate step in which a via is formed through insulator 310 to connect an underlying portion of a stacked polysilicon capacitor to an overlying polysilicon conductor, a non-volatile memory cell, such as a ROM cell, may be manufactured using a DRAM memory manufacturing process. As the same process may be used to manufacture both DRAMs and non-volatile memories concurrently, with some modifications, both types of memory may be formed on a same silicon substrate. Furthermore, should be noted that the formation of the via to connect the polysilicon conductor to the stacked polysilicon capacitor structure may be implemented using a number of well-known processing techniques. Furthermore, it should be noted that conductors other than doped polysilicon may be utilized to tie the stacked polysilicon device to a known logic state. Such other conductors may include titanium, aluminum, tungsten and/or copper.

Figure 5A:
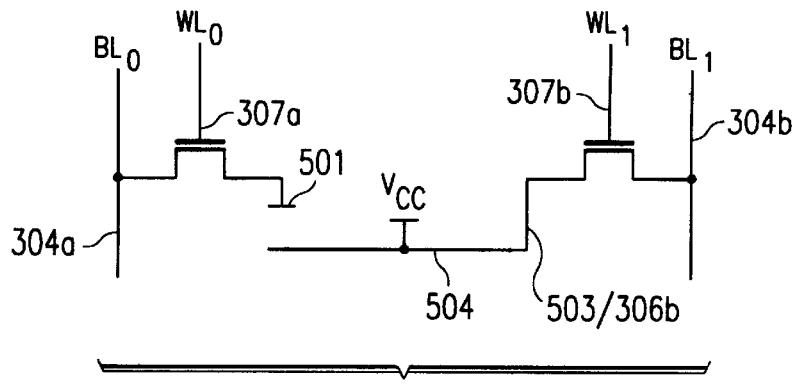
FIG. 5A illustrates, in circuit diagram form, a non-volatile memory implemented in accordance with the principles of the present invention.
Figure 5B:
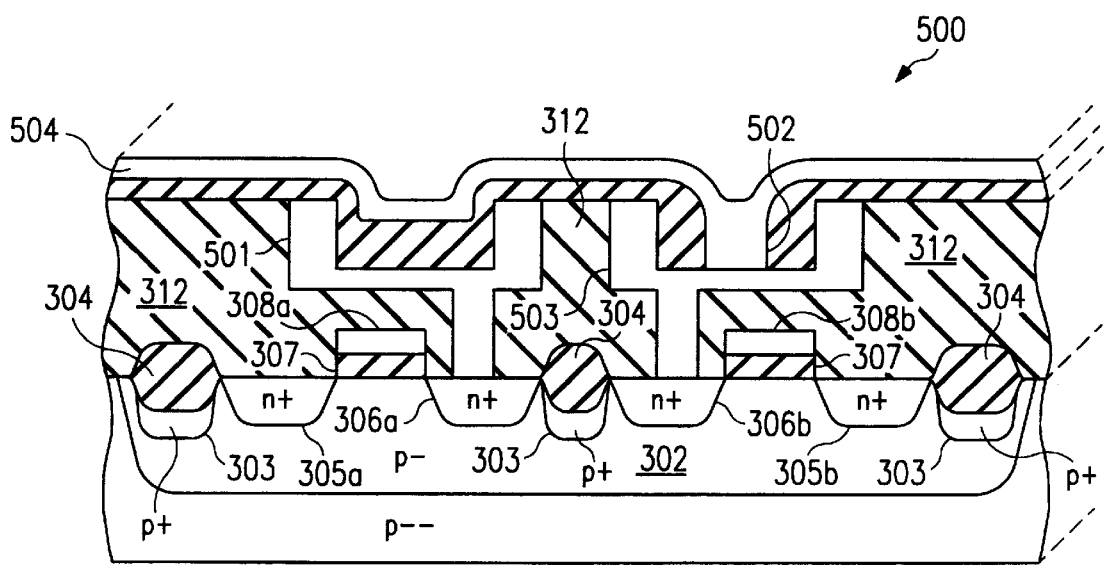
FIG. 5B illustrates, in a cross-sectional view, the non-volatile memory device of FIG. 5A.

FIGS. 5A and 5B illustrate an alternate embodiment of a ROM cell of the present invention. One embodiment of the invention illustrated in FIGS. 5A and 5B only selectively couples electrodes of transistors programmed to a $V_{CC}$ value to a $V_{CC}$ source. Transistors which are programmed to a logic low (or $V_{SS}$) value are not tied to a $V_{SS}$ logic level, and are left "floating." This implementation of the present invention requires that only one via be patterned and etched and that doped polysilicon conductor 504 only be coupled to one portion of a stacked polysilicon capacitor forming one electrode of a transistor that is programmed to a logic high, or $V_{CC}$, value. The via is labeled via 502 and conductor 504 is tied to $V_{CC}$.

Again, note that the steps required to implement the ROM cell of FIG. 5B have previously been described with respect to implementation of the DRAM memory cells in FIG. 3B. As these methodologies have been previously discussed, the methodologies will not be described in further detail with respect to FIG. 5B.

Furthermore, Note that in FIG. 5B, a contact is only cut through the oxide to a stacked capacitor structure 503 (a terminal of a capacitor in a DRAM cell) of the memory cells coupled to $V_{CC}$, while stacked capacitor structure 501 remains floating and is not coupled to any reference voltage. It should be noted that stacked capacitor structure 503 is coupled to the $V_{CC}$ reference voltage, while a terminal of the other transistor remains floating. Conductive layer 504 is coupled to $V_{CC}$ to couple the memory cell to a known logic state.

Figure 6A:
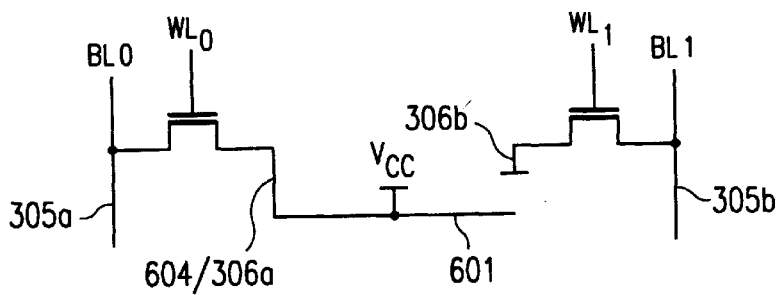
FIG. 6A illustrates, in circuit diagram form, one embodiment of a non-volatile memory implemented in accordance with the principles of the present invention.
Figure 6B:
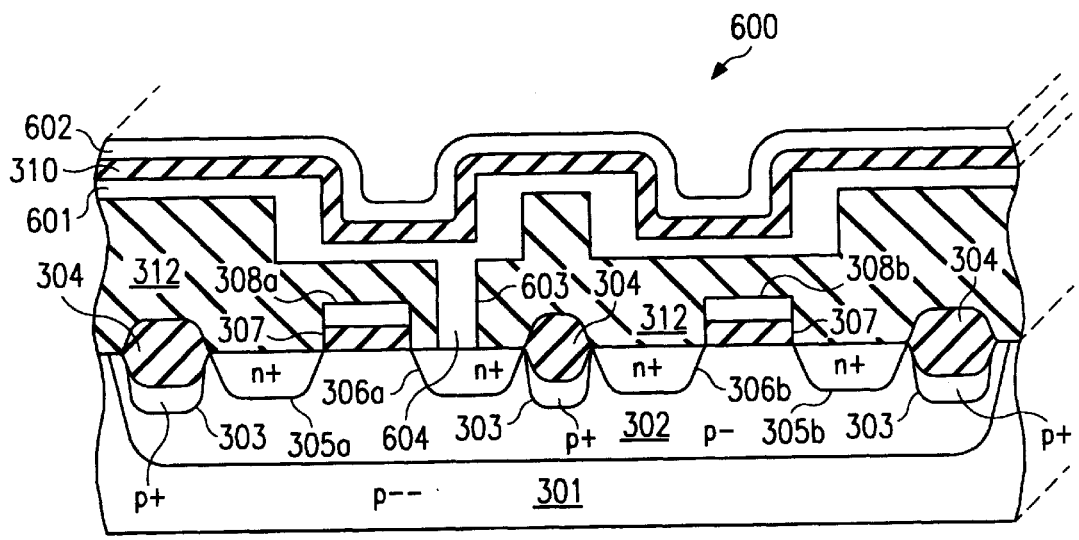
FIG. 6B illustrates, in a cross-sectional view, the non-volatile memory device of FIG. 6A.

FIGS. 6A and 6B illustrate an alternate embodiment of the present invention. FIG. 6A illustrates non-volatile memory cells that appear to be similar to the non-volatile memory cells illustrated in FIG. 5A. Specifically, a node of a memory cell that is programmed to a logic low (or $V_{SS}$) value is allowed to "float," while a memory cell that is programmed to a logic high value is coupled to a logic high reference voltage, $V_{CC}$. However, the non-volatile memory cells provided in FIGS. 5A and 6A are significantly structurally different.

Refer now to FIG. 6B for a cross-sectional view of the memory cells manufactured in accordance with one embodiment of the present invention. The steps required to implement the non-volatile memory cell of FIG. 6B have previously been described with respect to implementation of the DRAM memory cells of FIG. 3B. Specifically, formation of the memory cells, up to the formation of the stacked capacitor structure, are substantially the same process as is required for DRAM cells. Therefore, as these methodologies have been previously discussed, implementation of these methodologies will not be described in further detail with respect to FIG. 6B.

Note, however, that in FIG. 6B, stacked capacitor structure 601 is modified such that a connection does not exist between stacked capacitor structure 601 and N+ diffusion 306b.

In FIG. 6B, stacked capacitor structure 601 extends across the cross-section of the silicon substrate being processed herein and is not separated into two independent stacked capacitor structures, such as those illustrated in FIGS. 3–5. Additionally, note that the stacked capacitor structure 601 is coupled to a reference voltage, such as $V_{CC}$. Thus, a drain region of the non-volatile memory cell is directly coupled to $V_{CC}$ and is, therefore, programmed to a logic high value. Additionally, note that a drain of the transistor forming the memory cell that is programmed to a logic low value is not connected to the stacked capacitor structure 601, but is allowed to float. Thus, in the memory cells illustrated in FIGS. 6A and 6B, there is no connection between stacked capacitor structure 601 and the drain of a transistor tied to a logic low value. Furthermore, a via is not formed in the process utilized and manufactured in the non-volatile memory cells of FIGS. 6A and 6B. Rather than utilizing the formation of a via to provide the connection, the memory cell illustrated in FIG. 6B merely couples stacked capacitor structure 601 to a $V_{CC}$ reference voltage. Additionally, when stacked capacitor structure 601 of the non-volatile memory cell illustrated in FIG. 6B is formed, a continuous conductive structure is formed. Stacked capacitor structure 601 does not allow diffusions and the stacked capacitor structure for cells that are programmed to a logic low value to be coupled together. Thus, by minor modifications in the patterning and manufacture of the memory cells, a non-volatile memory cell may be manufactured on a same silicon substrate as a DRAM memory cell.

Figure 7:
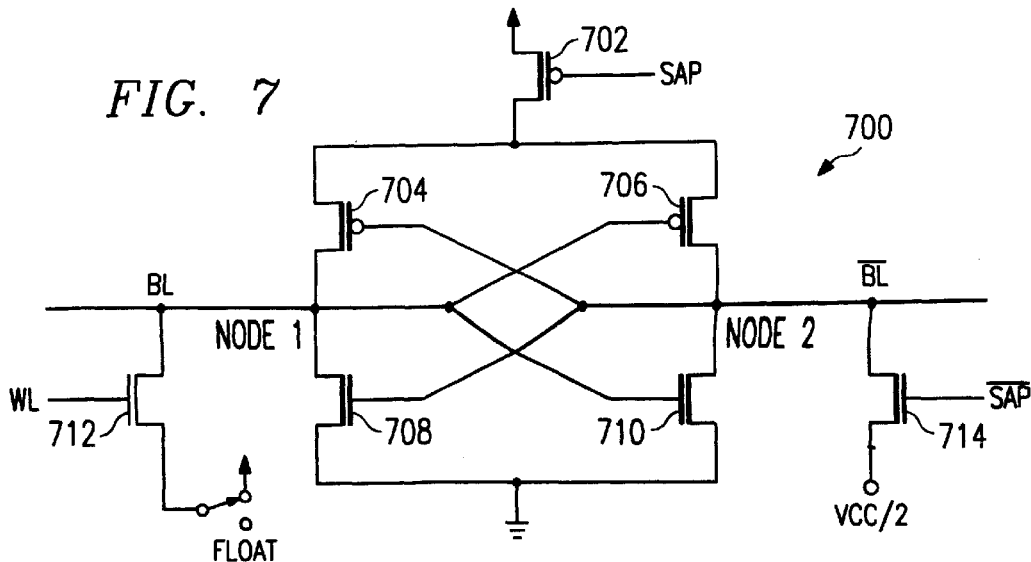
FIG. 7 illustrates, in circuit diagram form, a sense amplifier in accordance with one embodiment of the present invention.

The unique structure of the ROM cell illustrated in FIGS. 5A, 5B, 6A, and 6B may utilize traditional sensing techniques. However, while not required, a sensing circuit such as that illustrated in FIG. 7 may provide more reliable sensing results. The unique sensing techniques implemented by the circuit illustrated in FIG. 7 are useful to read the states stored within the non-volatile memory cells of the present invention. Particularly, because the non-volatile memory cells of the present invention illustrated in FIGS. 5 and 6 implement memory cells that are left "floating" when set to a logic low value, a unique sense amp may be implemented to detect the floating state of a memory cell and recognize that floating state as a logic low value. FIG. 7 illustrates a sense amp that may be utilized in one embodiment of the present invention.

In FIG. 7, a sense amplifier 700 is illustrated in greater detail. Sense amplifier 700 comprises a pull-up (pre-charge)

transistor 702, a pair of cross-coupled p-channel transistors 704 and 706, and a pair of cross-coupled n-channel transistors 708 and 710.

A first terminal of transistor 702 is coupled to a first reference voltage and a second terminal of transistor 702 is coupled to a SAP (Sense Amplifier P-channel) signal. A third terminal of transistor 702 is coupled to a first terminal of each of transistors 704 and 706. A second terminal of transistor 704 is coupled to a third terminal of transistor 706 and a second terminal of transistor 706 is coupled to a third terminal of transistor 704. The third terminal of transistor 704 is also coupled to a first terminal of transistor 708. A second terminal of transistor 708 is coupled to the third terminal of transistor 706 and a third terminal of transistor 708 is coupled to a reference ground voltage. A first terminal of transistor 710 is coupled to the third terminal of transistor 706, second terminal of transistor 710 is coupled to the third terminal of transistor 704, and a third terminal of transistor 710 is coupled to the reference ground voltage. A first terminal of transistor 712 is coupled to half-bitline BL 716a of bitline 716 and to the third terminal of transistor 704. A second terminal of transistor 712 is coupled to a WL (Wordline) signal. A third terminal of transistor 712 is selectively coupled to the first reference voltage and a floating state. A first terminal of transistor 714 is coupled to a half-bitline 716a of bitline 716 $\overline{\text{BL}}$ (Bitline) and to the third terminal of transistor 706. A second terminal of transistor 714 is coupled to $\overline{\text{SAP}}$ signal. A third terminal of transistor 714 is coupled to a $$\frac{V_{CC}}{2}$$

voltage value.

During operation, assume that a memory cell has been programmed to a logic high value. Therefore, the third terminal of transistor 712 will be coupled to a $V_{CC}$ value. When the WL signal is asserted to access the memory cell, the SAP signal is negated and the $\overline{\text{SAP}}$ signal is asserted. When the WL signal is asserted, transistor 712 begins conducting and starts to "pull" BL 716a (node 1) to a $V_{CC}$ value. As Node 1 rises towards $V_{CC}$, transistor 710 is enabled and transistor 706 is turned off. As a voltage provided to the gate of transistor 710 rises to a certain level (namely a $V_T$ value), Node 2 $\overline{\text{BL}}$ signal are pulled to the ground reference voltage. Node 2 and the $\overline{\text{BL}}$ signal are pulled to the ground reference voltage even though transistor 714 is enabled and is connected to a $$\frac{V_{CC}}{2}$$

voltage value because transistor 714 is implemented as a long channel transistor. Because transistor 714 is a long channel device, transistor 714 has a high impedance and transistor 710 may easily pull the $\overline{\text{BL}}$ signal and Node 2 to the ground reference voltage.

As the $\overline{\text{BL}}$ signal goes to the ground reference voltage, transistor 704 is enabled and transistor 708 is "turned off." When transistor 704 is enabled and transistor 702 is enabled, Node 1 is pulled more quickly to the $V_{CC}$ reference value. Thus, in sense amplifier 700, transistors 704 and 710 are enabled when a memory cell stores a logic high value. Conversely, transistors 706 and 708 are "turned off" when the memory cell stores the logic high value.

It should be noted that the memory device accessed by sense amplifier 700 is an active device, meaning that it is directly coupled to a $V_{CC}$ reference voltage. Because the memory cell is directly connected to a known reference voltage, sense amplifier 700 is not required to precharge the BL and $\overline{\text{BL}}$ signals during operation. This saves a significant amount of time during data processing steps and decreases the overhead associated with the memory system.

Alternatively, when the memory cell is programmed to a logic low value, the terminal of transistor 712 is left floating. As previously discussed, when the WL signal is asserted to access the memory cell formed by transistor 712, the SAP signal is negated and the $\overline{\text{SAP}}$ signal is asserted. When the memory cell is programmed to a logic low value, the reference voltage used during the sensing operation is $$\frac{V_{CC}}{2}.$$

Thus, when the $\overline{\text{SAP}}$ signal is asserted, transistor 714 is enabled and begins pulling Node 2 and the $\overline{\text{BL}}$ signal to a $$\frac{V_{CC}}{2}.$$

As Node 2 begins rising, transistor 708 is enabled and transistor 704 is disabled. Subsequently, when transistor 708 is enabled, Node 1 and the BL signal are pulled to the reference ground voltage. Additionally, as the BL signal and Node 1 are pulled to the reference ground voltage, transistor 706 is enabled. When transistor 706 and transistor 702 are both enabled, Node 2 and the $\overline{\text{BL}}$ signal are pulled to a $V_{CC}$ value. As there is no active voltage reference coupled to the BL signal, the BL signal and Node 1 may be easily pulled to a ground voltage level. By using such a methodology, a memory cell, even a memory cell that has a floating drain, may be accurately sensed by the sense amplifier illustrated in FIG. 7.

Single chip processing systems including on-board ROM and DRAM have substantial advantages over the prior art. Specifically, in the prior art systems, the operating system is copied from "boot" ROM into the DRAM of (reserved) system memory. Thus, the operating system disadvantageously resides in two physical locations: reserved system memory and boot ROM. According to the principles of the present invention, the operating system need only be stored in one location, thereby freeing up memory for other uses.

According to the present principles, the operating system code can be stored in ROM as the same "reserved" memory space which formally was provided by system memory DRAM. In other words, the operating system is provided on-chip in ROM and in the same memory space as the DRAM. Thus, a processor can simply access ROM directly for operating system code, leaving RAM space free.

The present principles also allow for the fabrication and programming of an electrically programmable read only memory (EPROM). This is best illustrated by reference to FIGS. 8A–8B.

Figure 8A:
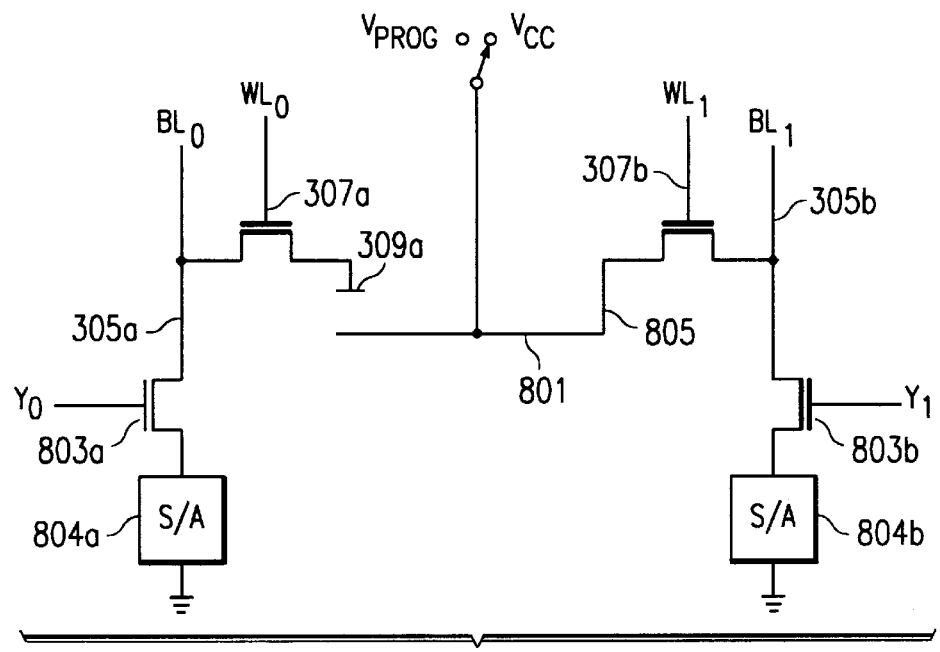
FIGS. 8A is a conceptual electrical schematic diagram of a pair of EPROM cells, the cell on the left programmed as a Logic 0 and the cell on the right programmed to a logic one. A cross-sectional view of the corresponding cells at the process level is shown generally at 800 in FIG. 8B.

FIGS. 8A is a conceptual electrical schematic diagram of a pair of EPROM cells, the cell on the left programmed as a Logic 0 and the cell on the right programmed to a logic one. A cross-sectional view of the corresponding cells at the process level is shown generally at 800 in FIG. 8B. The following discussion details the programming of the DRAM cells of FIG. 3B as EPROM cells, with the results being the cells FIGS. 8A and 8B.

Figure 8B:
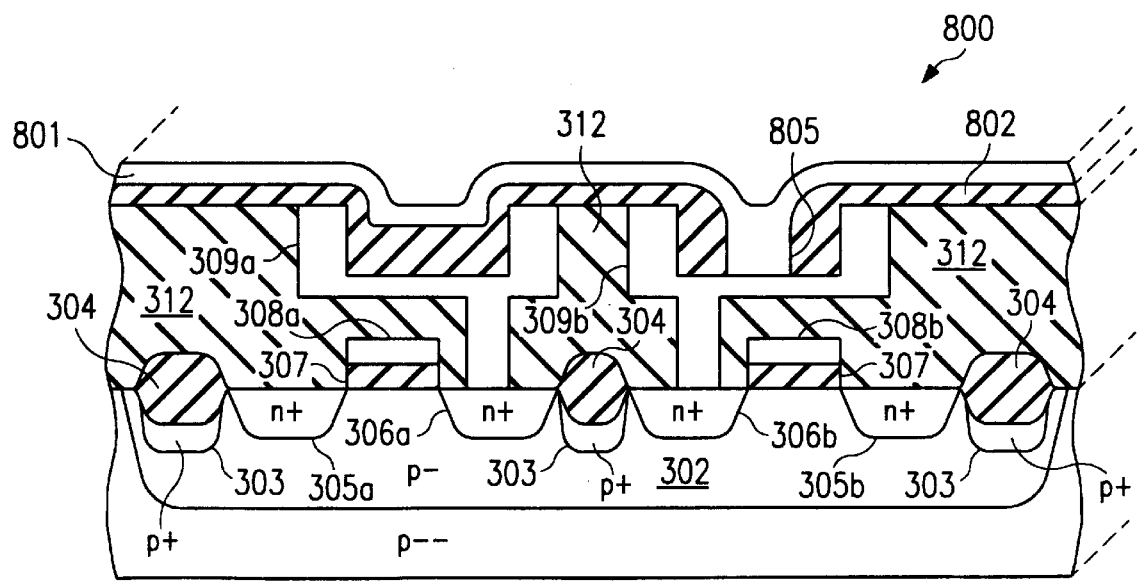

To program a cell, such as the right-hand cell of FIGS. 8A and 8B, a short is created between the common upper plate 801 and lower plate 309b through dielectric 802. Specifically, the wordline for the selected is activated turning on the selected cell as well and those along the given row. In this example wordline 308b is activated. Then a high voltage is $V_{PROG}$ switched to upper plate 801. At the same time, isolation transistor 803b (FIG. 8A) is turned on by the Y-decoder (column decoder) and sense amplifier 804b (FIG. 8A) switches the corresponding bitline 305b to ground. A sufficiently high voltage field is thereby created across dielectric layer 802 that the dielectric material (which could be, for example, an oxide) breaks down causing the short 805.

The exact value of $V_{PROG}$ is determined from such factors as the thickness and type of the dielectric, as known in the art. $V_{PROG}$ can be brought on-chip from an external source via a pin, or can be generated on-chip. It should be noted that it may be necessary to regulate the current through the bitlines 304 which are shorted to upper capacitor plate 801. Current regulation can be achieved by controlling the gate voltage of transistors 803. In particular, a sufficiently low voltage can be applied to the gate of the appropriate transistor (in this case transistor 803b) via the Y-decode drivers to limit the current to each selected bitline during programming of a logic 1 state. Advantageously the present principles require only one high voltage path in the core of the memory.

While cells are being programmed to a Logic 1 along an active wordline, other cells may be selected to remain in the Logic 0 state (i.e. no short between upper plate 801 and lower plate 309). The left cell in FIGS. 8A and 8B is an example of a cell left "unprogrammed" such that it stores a Logic 0. When the corresponding wordline is activated, the lower plates 309 of the cells along the row to remain in an "unprogrammed" state are allowed to float. This can be achieved by turning off the isolation transistors 803. Then, by slowly ramping the upper plate 801 to the programming voltage $V_{PROG}$, a sufficiently low field will be created across the dielectric 802 for those cells having floating lower plates 301 and no shorting will occur.

It should be noted that the description provided herein is but one example of an implementation of the present invention. It should be noted that many additional implementations may also be utilized to realize the present invention. Furthermore, while there have been described herein the principles of the invention, it is to be clearly understood to those skilled in the art that this description is made by way of example only and not as a limitation to the scope of the invention. Accordingly, it is intended, by the appended claims, to cover all modifications of the invention which fall within the true spirit and scope of the invention.

What is claimed is:

1. A method of permanently programming selected cells of a dynamic random access memory cell array comprising the steps of:
   programming a first selected cell to store a logic 1 comprising the substeps of:
      grounding a first capacitor plate of said first cell; and
      applying a programming voltage to a second capacitor plate common to the cells of the array to cause a dielectric disposed between the first capacitor plate and the second capacitor plate to breakdown thereby shorting the first and second capacitor plates; and
   programming a second selected cell to store a logic 0 comprising the substeps of:
      allowing a first capacitor plate of the second cell to float during a period when the programming voltage is applied to the second capacitor plate.

2. The method of claim 1 wherein said step of grounding comprises the step of coupling the first capacitor plate of the first cell to ground through a sense amplifier.

3. The method of claim 1 wherein said step of grounding comprises the step of coupling the first capacitor plate of the first cell to ground through a bitline selectively coupled to the first cell.

4. The method of claim 1 wherein said step of applying a voltage to the second capacitor plate comprises the step of slowly ramping the voltage on the second capacitor plate.

5. The method of claim 1 wherein said step of grounding comprises the step of coupling said first capacitor plate to ground through a transistor forming a part of said first cell in response to a voltage presented on a wordline associated with a corresponding row in the array.

6. A method of programming selected cells in an array of rows and columns of memory cells, the cells of the array sharing a common capacitor plate and each cell having data storage capacitor plate spaced from the common capacitor plate by a dielectric, the method comprising the steps of:
   activating a wordline coupled to first and second cells of a selected row in the array for coupling the first cell to a first bitline and the second cell to a second bitline;
   coupling the first bitline to a low voltage;
   allowing the second bitline to float with respect to said low voltage for programming the second cell to a logic zero;
   applying a programming voltage to the common capacitor plate for creating a short between the common plate and the storage plate of the first capacitor through the dielectric thereby programming the first cell to a logic one.

7. The method of claim 6 wherein the low voltage is ground.

8. The method of claim 6 wherein said step of applying a programming voltage comprises the step of slowing ramping the voltage of the common plate.

9. The method of claim 6 wherein said step of coupling the first bitline to a low voltage comprises the step of coupling the first bitline to ground through a sense amplifier coupled to the first bitline.

10. The method of claim 6 wherein said step of allowing said second bitline to float comprises the step of isolating the second bitline from ground with an isolation transistor.

11. The method of claim 10 wherein a gate of said isolation transistor is controlled by a signal from a column decoder associated with the array.

12. The method of claim 6 and further comprising the step of regulating a current generated between the common plate and the low voltage.

13. The method of claim 12 wherein said step of regulating comprises the step of regulating current with a transistor coupling the common plate and the low voltage.

14. The method of claim 6 wherein the array of memory cells comprise electrically programmable read-only memory cells fabricated using a DRAM process.

15. An electrically programmable read-only memory cell array fabricated using a dynamic random access memory process comprising:
   a common capacitor plate;
   a dielectric layer disposed adjacent the common capacitor plate;
   a first cell storing a logic zero comprising a storage capacitor plate spaced from said common capacitor plate by said dielectric layer; and
   a second cell storing a logic one comprising a storage capacitor plate shorted to said common capacitor plate through said dielectric layer.

16. The memory cell of claim 15 wherein said common capacitor plate is coupled to Vcc.

17. The memory cell of claim 15 and further comprising circuitry for applying a programming voltage to said common capacitor plate for programming.

18. An memory chip comprising:

an electrically programmable read-only memory cell fabricated using a DRAM process comprising:

a first capacitor plate spaced from a second capacitor plate by a dielectric; and a transistor for selectively coupling said second capacitor plate to a bitline; and circuitry for programming said memory cell, said circuitry operable to:

program said cell to a logic 1 by grounding said second plate and applying a programming voltage to said first plate to cause said dielectric to breakdown and short the first and second plates; and program said cell to a logic 0 by allowing said second plate to float during a period when the programming voltage is applied to said first capacitor plate.

19. The memory chip of claim 18 wherein said circuitry for programming comprises a sense amplifier for coupling said second plate to ground through said bitline.

20. The memory chip of claim 18 and further comprising a dynamic random access memory cell fabricated on said chip using said DRAM process.

\* \* \* \* \*

UNITED STATES PATENT AND TRADEMARK OFFICE
CERTIFICATE OF CORRECTION

PATENT NO. : 5,995,409 Page 1 of 1
APPLICATION NO. : 09/045259
DATED : November 30, 1999
INVENTOR(S) : Wayland Bart Holland It is certified that error appears in the above-identified patent and that said Letters Patent is hereby corrected as shown below:

Column 1
Line 13, "...Ser. No. 08/759,764 (Attorney Docket No. 2836-P05445), entitled "DIGITAL STEP GENERATORS AND CIRCUTS, SYSTEMS AND METHODS USING THE SAME" filed Dec. 3, 1996" should read --...Ser. No. 08/955,045 (Attorney Docket No. 17200-P007US), entitled NON-VOLATILE AND MEMORY PROCESS AND METHODS THEREFOR filed March 20, 1998.--

Signed and Sealed this

Second Day of October, 2007

JON W. DUDAS
*Director of the United States Patent and Trademark Office*